(12) United States Patent
Uemoto et al.

(10) Patent No.: US 9,368,323 B2
(45) Date of Patent: Jun. 14, 2016

(54) CHARGED PARTICLE BEAM DEVICE, CONTROL METHOD FOR CHARGED PARTICLE BEAM DEVICE, AND CROSS-SECTION PROCESSING OBSERVATION APPARATUS

(71) Applicant: HITACHI HIGH-TECH SCIENCE CORPORATION, Minato-ku, Tokyo (JP)

(72) Inventors: Atsushi Uemoto, Tokyo (JP); Xin Man, Tokyo (JP); Tatsuya Asahata, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 0 days.

(21) Appl. No.: 14/601,497

(22) Filed: Jan. 21, 2015

(65) Prior Publication Data
US 2015/0206702 A1    Jul. 23, 2015

(30) Foreign Application Priority Data

Jan. 23, 2014  (JP) ................................ 2014-010398

(51) Int. Cl.
H01J 37/26    (2006.01)
(52) U.S. Cl.
CPC ............ *H01J 37/265* (2013.01); *H01J 2237/15* (2013.01); *H01J 2237/30483* (2013.01)

(58) Field of Classification Search
USPC .................. 250/305, 306, 307, 309, 310, 311
See application file for complete search history.

(56) References Cited

U.S. PATENT DOCUMENTS

| 5,401,972 A | 3/1995 | Talbot et al. ................ 250/491.1 |
| 5,532,494 A | 7/1996 | Kawanami et al. ......... 250/491.1 |
| 2010/0008563 A1 | 1/2010 | Fujii et al. ..................... 382/149 |
| 2014/0226003 A1* | 8/2014 | Phaneuf ................ H01J 37/222 348/80 |

FOREIGN PATENT DOCUMENTS

| JP | 6295694 | 10/1994 |
| JP | 7201300 | 8/1995 |
| JP | 2009204480 | 9/2009 |

* cited by examiner

*Primary Examiner* — Nicole Ippolito
(74) *Attorney, Agent, or Firm* — Adams & Wilks

(57) ABSTRACT

A cross-section processing observation apparatus includes an ion beam control unit which controls a charged particle beam generation-focusing portion and a deflector, and a DAC which converts an input digital signal into an analog signal which is to be input to the deflector. A field-of-view setting portion sets a value of a field of view of a charged particle beam where the scanning performed by the deflector is performed on the basis of a set value of a slice amount, and the field-of-view setting portion is configured to set a value of one-nth of the slice amount, where n is a first natural number, as an input digital value "1" of the digital/analog converter and to set a value obtained by multiplying said value set as the input digital value "1" by a second natural number as a value of the field of view.

5 Claims, 3 Drawing Sheets

CHARGED PARTICLE BEAM DEVICE, CONTROL METHOD FOR CHARGED PARTICLE BEAM DEVICE, AND CROSS-SECTION PROCESSING OBSERVATION APPARATUS

This application claims priority from Japanese Patent Application No. 2014-010398 filed on Jan. 23, 2014, the entire subject-matter of which is incorporated herein by reference.

BACKGROUND

1. Technical Field

The present disclosure relates to a charged particle beam device, a control method for the charged particle beam device, and a cross-section processing observation apparatus.

2. Description of the Related Art

A charged particle beam device (also referred to as a focused ion beam device or the like) is a device which detects generated secondary electrons or the like in order to observe a microscopic image, or performs etching processing on a sample surface, by scanning the sample surface with a thinly focused ion beam. In addition, the charged particle beam device can build a system which obtains three-dimensional reconstructed image data by repeatedly performing processing of a very thin cross-section and a microscopic observation in combination with a scanning type electron microscope or the like (for example, JP-A-2009-204480).

In the charged particle beam device, the sample surface is scanned with a focused ion beam which is focused on the sample surface, by a deflector in a two-dimensional direction. A scanning range of the focused ion beam is indicated by a size of a scanning range on the sample surface, called a field of view (FOV), in cross-section processing or a microscopic observation. In addition, the FOV forms a two-dimensional plane including a plurality of pixels. A size of a single pixel in this case is a value corresponding to a unit scanning amount of the focused ion beam by the deflector (for example, JP-A-H06-295694 and JP-A-H07-201300).

The deflector which performs scanning with a focused ion beam is generally controlled by a computer. In this case, the computer generates a predetermined digital signal so as to control the deflector. In addition, the deflector is controlled by using a predetermined analog signal into which the digital signal is converted. In this case, a resolution of scanning or a scanning range of a focused ion beam by the deflector depends on the number of conversion bits of a digital/analog converter (DAC) which converts a digital signal output from the computer into an analog signal for controlling the deflector. For example, in a case of a 16-bit DAC, a range of values which can be converted is 0 to 65535 (or −32798 to 32767). In a case where, in the conversion range of 0 to 65535 of the 16-bit DAC, the range of 0 to 51200 is made to correspond to an FOV of which one side is 120 μm, the minimum analog output value (that is, a resolution) corresponding to an input value "1" of the DAC is calculated to about 2.34 nm (=120 μm/51200) as a scan length.

On the other hand, the above-described method of obtaining a three-dimensional reconstructed image data by repeatedly performing the thin cross-section processing and the microscopic observation is called a cut-and-see method, and a target object thereof is mainly a metal material or a semiconductor. In a case where a metal material or a semiconductor is used as an observation target object (that is, a sample), a thickness (that is, a slice amount) in cross-section processing per observation is typically of an order of about an nm order, and a length of one side of an FOV falls within about 10 μm in most cases. In contrast, a three-dimensional (3D) observation of a biological sample has recently attracted attention. Also in a case of the biological sample, a slice amount at one observation is required to have the fineness of an order of about nm. However, a size of a cell is large unlike metals, and thus an FOV with a length of about 100 μm to 150 μm is required to be used. For this reason, in relation to a size of a processing range (that is, a size of an FOV), a processing size having a large scaling ratio which is not considered in the related art is necessary, such as one side of 100 μm to 150 μm and a processing pitch (that is, a slice amount) of, for example, 2 nm. In the cut-and-see method, there is a case where one observation is performed for each slice, and also a case where an observation is not performed although slicing is performed, such as one observation being performed for every five slices.

As in the above-described example of a biological sample, in a case where an FOV has a relatively large size, and a slice amount has a very small value, the following problem may occur. In other words, for example, in a case of using the above-described 16-bit DAC, a resolution is about 2.34 nm when one side of the FOV is set to 120 μm. In this case, it is not possible to set a slice amount to, for example, 2 nm. In consideration of necessary quantization accuracy, the minimum value of an actual slice amount is limited to about fifty times the resolution, that is, 117 nm (=2.34 nm×50). In other words, if a slice amount is to be set to 2 nm by using the FOV of 120 μm, it is necessary to use a DAC having a resolution of about 1/50 or about 1/100 of the resolution of the 16-bit DAC. In this example, it is necessary to use a DAC having the number of bits of at least about 22 to 23 bits. However, this change of a DAC leads to a change of hardware and is thus problematic in that development cost increases.

SUMMARY

Illustrative aspects of the present invention provide a charged particle beam device, a control method for the charged particle beam device, and a cross-section processing observation apparatus capable of increasing processing accuracy even by using a DAC with a small number of bits.

According to one illustrative aspect of the present invention, there may be provided a charged particle beam device comprising: a charged particle beam column comprising: a charged particle beam generation-focusing portion configured to generate and focus a charged particle beam; and a deflector configured to perform scanning with the charged particle beam in a two-dimensional direction; a charged particle beam control unit, which is configured to control the charged particle beam generation-focusing portion and the deflector, and which comprises a digital/analog converter for converting an input digital signal into an analog signal that is to be input to the deflector; and a field-of-view setting unit configured to set a value of a field of view of the charged particle beam where the scanning by the deflector is performed on the basis of a set value of a slice amount.

According to another illustrative aspect of the present invention, the charged particle beam device may further comprise a display unit for displaying a charged particle beam image with the field of view set by the field-of-view setting unit.

According to still another illustrative aspect of the present invention, in the charged particle beam device, the field-of-view setting unit may be configured to set a value of one-nth of the slice amount, where n is a first natural number, as an input digital value "1" of the digital/analog converter and to set a value obtained by multiplying said value set as the input digital value "1" by a second natural number as a value of the field of view.

According to still another illustrative aspect of the present invention, in the charged particle beam device, the field-of-view setting unit may be configured to switch: a case where the value of one-nth of the slice amount is set as the input digital value "1" of the digital/analog converter, and the value obtained by multiplying said value set as the input digital value "1" by the second natural number is set as the value of the field of view; and a case where the value of the field of view is set, and the slice amount calculated from said set value of the field of view is set as the input digital value "1" of the digital/analog converter, and the field-of-view setting unit may be configured to set the value of the field of view of the charged particle beam by the scanning performed by the deflector and the slice amount.

According to still another illustrative aspect of the present invention, there may be provided a cross-section processing observation apparatus comprising: the charged particle beam device according to any one of the above illustrative aspects; and an observation device for observing a sample processed by the charged particle beam device.

According to still another illustrative aspect of the present invention, there may be provided a control method for a charged particle beam device, wherein the charged particle beam device comprises: a charged particle beam column comprising a charged particle beam generation-focusing portion configured to generate and focus a charged particle beam and a deflector configured to perform scanning with the charged particle beam in a two-dimensional direction; a charged particle beam control unit that controls the charged particle beam generation-focusing portion and the deflector and includes a digital/analog converter for converting an input digital signal into an analog signal that is to be input to the deflector; and a field-of-view setting unit, the method comprising using the charged particle beam device and the charged particle beam control unit and controlling the field-of-view setting unit to set a value of a field of view of a charged particle beam where the scanning by the deflector is performed on the basis of a set value of a slice amount.

According to the illustrative aspects of the present invention, a value of a field of view of a charged particle beam where the scanning by the deflector is performed is set on the basis of a set value of a slice amount. Therefore, if a slice amount is set to a value such as a natural number which does not cause a fractional figure, a digital signal which is input to the digital/analog converter of the charged particle beam control unit can correspond to a value of a natural number multiple of the slice amount without an error at all times. Therefore, according to the present invention, it is possible to easily increase processing accuracy without increasing the number of bits of a digital/analog converter.

DETAILED DESCRIPTION

Figure 1:
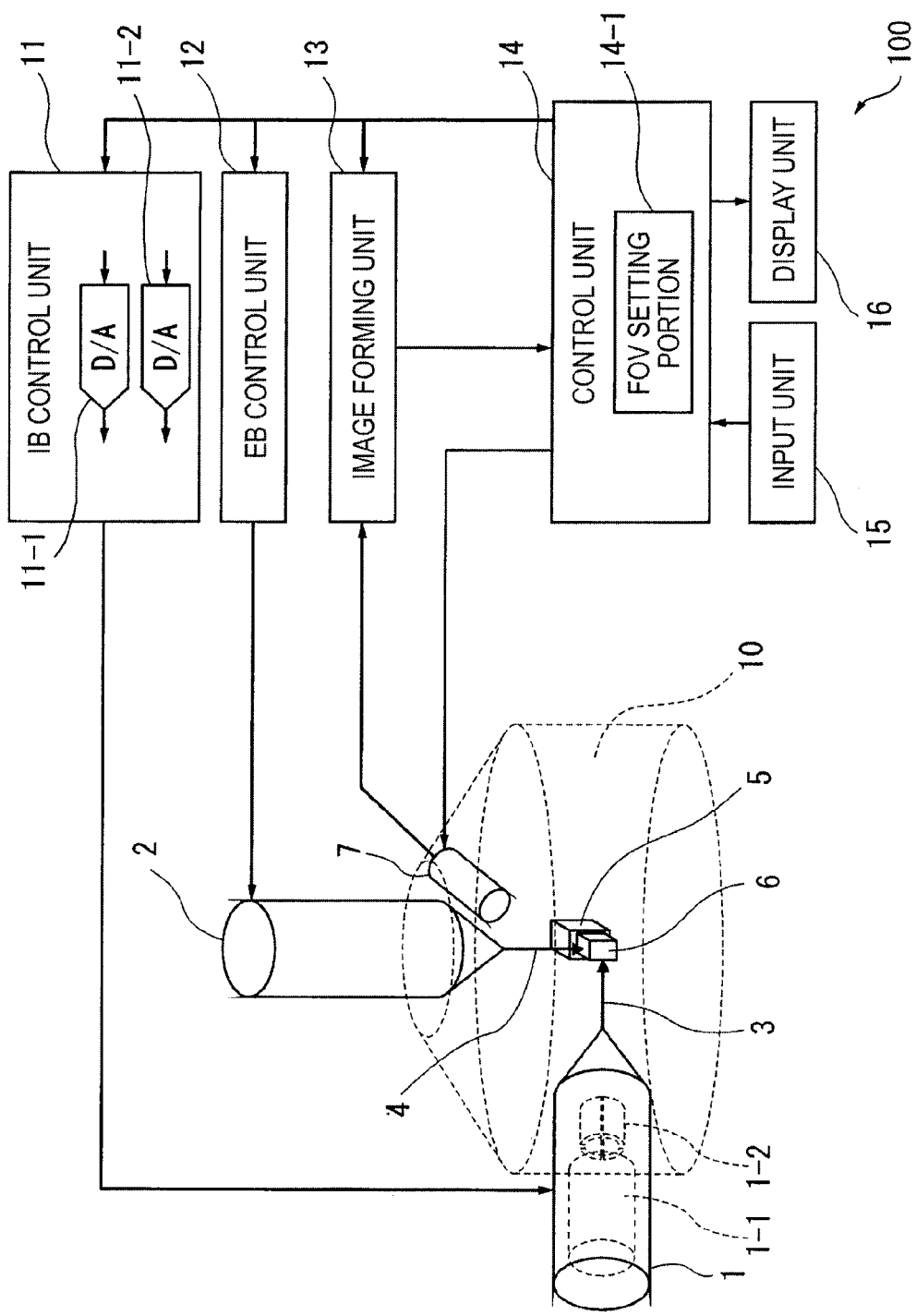
FIG. 1 is a configuration diagram schematically illustrating a configuration example of one embodiment of a cross-section processing observation apparatus of the present invention.

Hereinafter, an embodiment of the present invention will be described with reference to the drawings. FIG. 1 is a configuration diagram schematically illustrating a configuration example of a cross-section processing observation apparatus as one embodiment of the present invention.

As illustrated in FIG. 1, a cross-section processing observation apparatus 100 includes an ion beam column 1 (charged particle beam column), an electron beam column 2, and a sample chamber 10. The ion beam column 1 and the electron beam column 2 are accommodated in the sample chamber 10. A sample 6 placed on a sample stage 5 is disposed so that a side surface and an upper surface thereof are irradiated with an ion beam 3 (charged particle beam) and an electron beam 4.

The ion beam column 1 includes an ion beam generation-focusing portion 1-1 (charged particle beam generation-focusing portion) and a deflector 1-2. The ion beam generation-focusing portion 1-1 includes an ion source which generates ions, and forms the ions extracted from the ion source into the ion beam 3 which is a focused ion beam. The deflector 1-2 deflects the ion beam 3 in two-axis directions, and scans an irradiation position of the ion beam 3 on the side surface of the sample 6 in two-dimensional directions. On the other hand, the electron beam column 2 includes an electron gun, a focusing lens, a scan coil, and an objective lens, and irradiates and scans the upper surface of the sample 6 with the electron beam 4 in two-dimensional directions.

The sample stage 5 can be moved, tilted, and rotated in XYZ directions, and can adjust an alignment of the sample 6 for each beam. The ion beam column 1 and the electron beam column 2 are disposed so that irradiation axes thereof are perpendicular to each other. Consequently, the electron beam 4 can be made to be vertically incident on a cross-section which is processed with the ion beam 3 and is exposed. In the cross-section processing observation apparatus 100 with such a configuration, in order to observe a cross-section of the sample 6 in a predefined observation target cross-section or in an observation region including the observation target cross-section, slice processing (that is, flake removal processing) is sequentially performed on the sample 6 so that a fracture position is moved and an observation cross-section is formed. The ion beam column 1 and the electron beam column 2 may be disposed so that the irradiation axes thereof are not perpendicular to each other but intersect each other.

In addition, the cross-section processing observation apparatus 100 includes an ion beam (IB) control unit 11 (charged particle beam control unit), and an electron beam (EB) control unit 12. The ion beam control unit 11 controls the ion beam generation-focusing portion 1-1 and the deflector 1-2, and includes digital/analog converters (DACs) 11-1 and 11-2 which convert a digital signal which is input from a control unit 14 into an analog signal which is input to the deflector 1-2. The ion beam control unit 11 transmits an irradiation signal to the ion beam column 1, and causes the ion beam column 1 to perform irradiation with the ion beam 3. The irradiation signal is a signal for controlling the ion beam generation-focusing portion 1-1 and the deflector 1-2, and includes analog signals for controlling an amount of ion beams deflected by the deflector 1-2. The analog signals are signals (or amplified signals thereof) output from the DACs 11-1 and 11-2, and the deflector 1-2 of the ion beam column 1 controls a deflection amount of ion beams, that is, a scanning amount according to the analog signals. On the other hand, the electron beam control unit 12 transmits an irradiation signal to the electron beam column 2 so as to cause the electron beam column 2 to perform irradiation with the electron beam 4. As mentioned above, a charged particle beam device constituting the cross-section processing observation apparatus 100 includes the ion beam column 1, the ion beam control unit 11, and the control unit 14.

In addition, the cross-section processing observation apparatus 100 includes a secondary electron detector 7. The secondary electron detector 7 detects secondary electrons which are generated from the sample 6 when the sample 6 is irradiated with the ion beam 3 or the electron beam 4.

Further, the cross-section processing observation apparatus 100 includes an image forming unit 13 which forms an observation image, and a display unit 16 which displays the observation image. The image forming unit 13 forms a scanning ion microscopic image (SIM image) on the basis of a signal for performing scanning with the ion beam 3 and a signal of secondary electrons detected by the secondary electron detector 7. The display unit 16 displays the SIM image. In other words, the display unit 16 displays a charged particle beam image with a field of view (FOV) set by an FOV setting portion 14-1 which will be described later. The image forming unit 13 forms a scanning electron microscopic image (SEM image) on the basis of a signal for performing scanning with the electron beam 4 and a signal of secondary electrons detected by the secondary electron detector 7. The display unit 16 displays the SEM image. As mentioned above, the cross-section processing observation apparatus 100 includes an observation device which is used to observe a sample processed by the charged particle beam device and is constituted by the secondary electron detector 7, the image forming unit 13, and the display unit 16.

Furthermore, the cross-section processing observation apparatus 100 includes the control unit 14 and an input unit 15. An operator inputs a condition regarding device control to the input unit 15. The input unit 15 transmits the input information to the control unit 14. The control unit 14 transmits control signals to the ion beam control unit 11, the electron beam control unit 12, and the image forming unit 13 so as to control the cross-section processing observation apparatus 100. In addition, the control unit 14 has a function of controlling movement, rotation, and the like of the sample stage 5 and controlling a state of the sample chamber 10.

Figure 2:
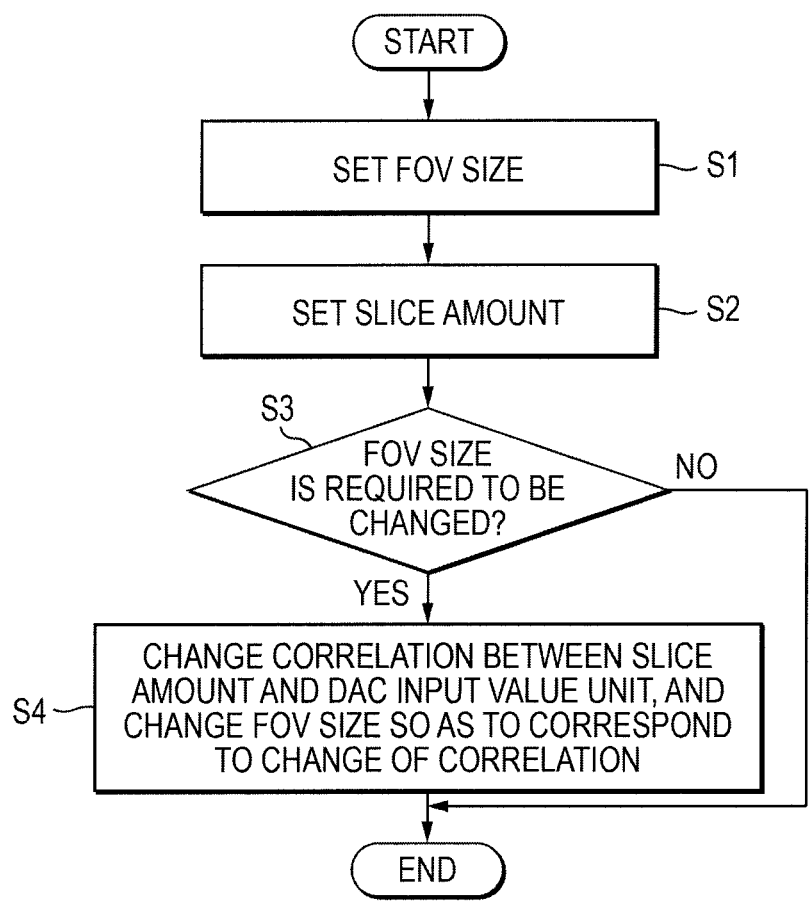
FIG. 2 is a flowchart illustrating an operation example of an FOV setting portion illustrated in FIG. 1.
Figure 3A:
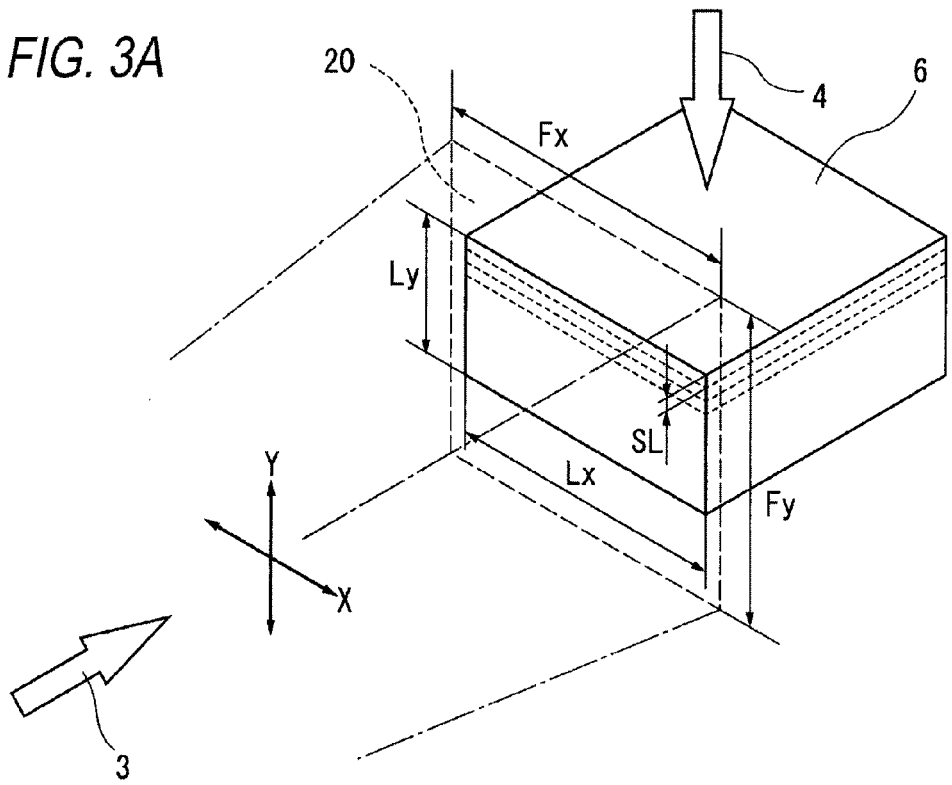
FIGS. 3A and 3B are schematic diagrams illustrating a setting example in the cross-section processing observation apparatus illustrated in FIG. 1.

In the present embodiment, the control unit 14 includes, especially, the FOV setting portion 14-1 (field of view setting portion). The FOV setting portion 14-1 is a program executed by a central processing unit (CPU) included in the control unit 14, and is stored in a predetermined storage device. Here, with reference to FIGS. 2 and 3, an operation of the FOV setting portion 14-1 will be described. FIG. 2 is a flowchart illustrating an operation example of the FOV setting portion 14-1 illustrated in FIG. 1. FIG. 3 is a schematic diagram illustrating a setting example of an FOV by the FOV setting portion 14-1.

Figure 3B:
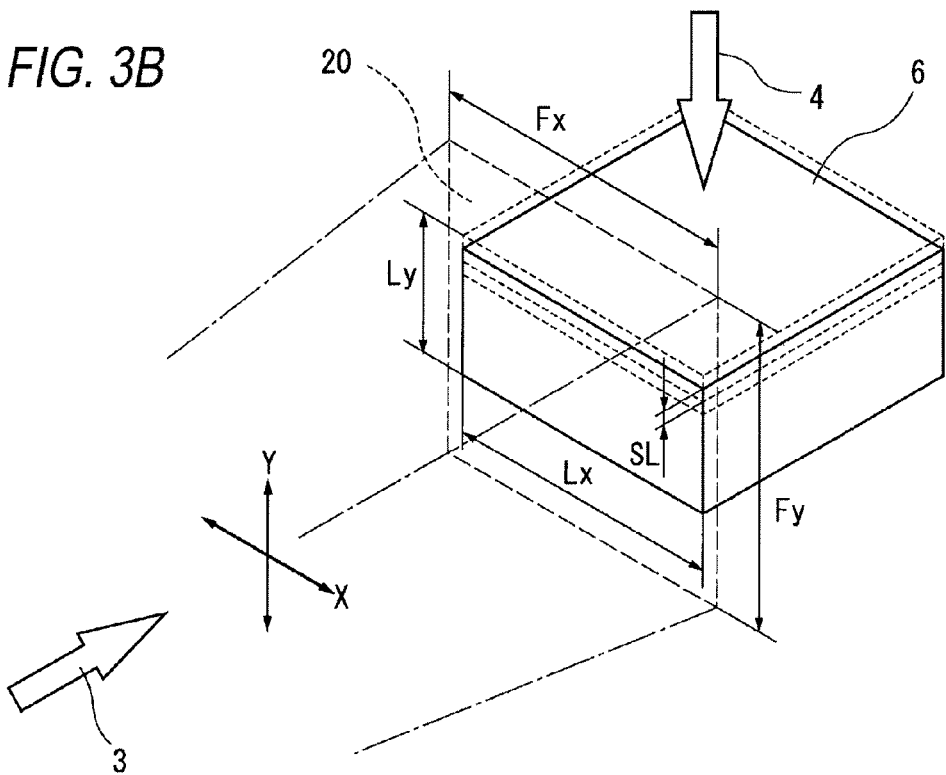

The FOV setting portion 14-1 sets a value of a field of view of the ion beam 3 where the scanning by the deflector 1-2 is performed and a slice amount. In an example illustrated in an example of FIG. 3A, the sample 6 is a cuboid. The sample 6 is scanned with the ion beam 3 in the X direction, and thus the sample 6 is cross-sectionally processed in a slice amount SL throughout the entire X direction. In addition, a size of the surface of the sample 6 irradiated with the ion beam 3 is a width Lx and a height Ly. In a case where cross-section processing and an observation are repeatedly performed, the sample 6 is repeatedly cut to be thinner in the irradiation direction of the electron beam 4. FIG. 3B illustrates a state after the sample 6 of FIG. 3A has undergone slice processing for one time. In the example illustrated in FIG. 3, when directions of the scan axis of the ion beam 3 are set to the X direction and the Y direction, a rectangular plane region indicated by a broken line of which a width length is Fx and a height length is Fy forms an FOV 20.

Next, an operation example of the FOV setting portion 14-1 will be described with reference to FIG. 2. In this example, a description will be made assuming that the number of bits of the DACs 11-1 and 11-2 is 16 bits, and the FOV 20 is square. It is assumed that the operator operates the input unit 15 so that a size of one side of the FOV is set to 100 μm (step S1), and a slice amount for one time is set to 2 nm (step S2), as setting conditions of slice processing for the sample 6. Next, the FOV setting portion 14-1 determines whether or not the FOV size set in step S1 is required to be changed (step S3). In step S3, the FOV setting portion 14-1 determines whether or not the FOV size is required to be changed from the viewpoint of whether or not sufficient processing accuracy can be obtained in a case where slice processing is performed in the slice amount set in step S2 with the FOV size set in step S1.

In step S3, for example, when the FOV size of 100 μm is correlated with 51200 of the conversion range 0 to 65535 of the 16-bit DAC, in a case where a value corresponding to an input value "1" of the DAC is equal to or smaller than 1/64 of the set slice amount, the FOV setting portion 14-1 determines that the accuracy is sufficient. Here, 1/64 is an example of a threshold value, and a threshold value is not limited thereto. In this case, a value corresponding to the input value "1" of the DAC is about 1.95 nm (=100 μm/51200). Therefore, 1.95 nm is larger than 1/64 of the slice amount of 2 nm, and thus it is determined that the accuracy is not sufficient. In addition, as an example, in a case where a FOV size is 10 μm, and a slice amount is 15 nm, a value corresponding to the input value "1" of the DAC is about 0.195 nm (=10 μm/51200). In this case, 0.195 nm is equal to or smaller than 1/64 of the slice amount of 15 nm. Therefore, it is determined that the accuracy is sufficient in this case.

If the FOV setting portion 14-1 determines that the FOV size is not required to be changed in step S3 ("NO" in step S3), the FOV setting portion 14-1 uses the FOV size and the slice amount without changing the values thereof set by the operator.

On the other hand, if the FOV setting portion 14-1 determines that the FOV size is required to be changed in step S3 ("YES" in step S3), the FOV setting portion 14-1 changes a correlation between a slice amount and a DAC input value unit, and changes the FOV size in correlation with the change of the correlation (step S4). In other words, in step S4, the FOV setting portion 14-1 sets an FOV size (a value of a field of view) of a charged particle beam where the scanning by the deflector is performed on the basis of a set value of the slice amount. Specifically, the FOV setting portion 14-1 sets a value such as 1/1, 1/2, or 1/3 (one-nth of the slice amount, where n is a first natural number) of a slice amount as the input digital value "1" of the DAC. In this case, input digital values "1", "2", "3", and the like of the DAC correspond to a slice amount (2 nm in this example). Next, a value obtained by multiplying the value set as the input digital value "1" by a predetermined natural number (multiplied by a second natural number) is set as sizes Fx and Fy of the FOV.

A correlation between a slice amount and an input digital value of the DAC may be determined depending on a scaling ratio of a slice amount and an FOV size. A size of the slice amount correlated with the input digital value "1" of the DAC is preferably as small as possible (that is, an input value of the DAC correlated with a slice amount (2 nm in this example) is preferably as great as possible, such as "2" greater than "1" and "3" greater than "2") from the viewpoint of reducing an offset error of the DAC. However, an input digital value corresponding to an FOV is limited to, for example, 51200. In addition, the FOV size is preferably as close to a value set by the operator in step S1 as possible. The FOV setting portion 14-1 sets a slice amount and an FOV to be suitable for this fact.

In this example, the FOV size is set to 100 μm in step S1, and the slice amount is set to 2 nm in step S2. Therefore, in step S4, for example, 1/1 of the slice amount, that is, 2 nm is set as the input digital value "1" of the DAC. In addition, 102.4 μm which is 51200 times greater than 2 nm is set as the FOV size. Then, on the basis of the results set by the FOV setting portion 14-1, the control unit 14 outputs a signal indicating that the input digital value "51200" of the DAC is the FOV size of 102.4 μm, to the ion beam control unit 11, and also generates a signal for shifting a slice location through changing by "1" with the slice amount (2 nm) as the input digital value "1" and outputs the signal to the ion beam control unit 11 as an input digital value.

In addition, if it is determined that the FOV size is not required to be changed in step S3 (NO in step S3), for example, in a case where the FOV size is 10 μm, and the slice amount is 15 nm in the above-described example, the control unit 14 outputs a signal indicating that the input digital value "51200" of the DAC is the FOV size of 10 μm to the ion beam control unit 11 on the basis of the results set by the FOV setting portion 14-1. Further, the control unit 14 calculates "77" (=(10 μm/51200)×77≈about 15.04 nm) or "76" (=(10 μm/51200)×76≈about 14.84 nm) in order to shift a slice location, that is, in order to set a slice amount. In other words, the control unit 14 outputs a signal indicating that the FOV size is 10 μm to the ion beam control unit 11, and generates a signal for shifting a slice location through changing by either "77" or "76" and outputs the signal to the ion beam control unit 11 as an input digital value.

As mentioned above, according to the present embodiment, an FOV is changed so that a slice amount (that is, a processing pitch or a feeding amount) matches a target unit, and thus a quantization error caused by an input value of the DAC is able to be eliminated. Therefore, it is possible to improve processing accuracy. In other words, according to the present embodiment, an FOV size (a value of a field of view) of a charged particle beam where the scanning by the deflector is performed is set on the basis of a set value of a slice amount. Therefore, if a slice amount is set to a value such as a natural number which does not cause a fractional figure, a digital signal which is input to the DAC of the ion beam control unit 11 can correspond to a value of a natural number multiple of the slice amount without an error at all times. Therefore, according to the present embodiment, it is possible to easily increase processing accuracy without increasing the number of bits of a digital/analog converter. In addition, according to the present embodiment, a value of one-nth of the slice amount, where n is the first natural number, is set as the input digital value "1" of the DAC (for example, when a slice amount is 2 nm, a value (=2 nm) of 1/1 thereof is set, or when a slice amount is 4 nm, a value (=2 nm) of 1/2 thereof is set). Further, a value obtained by multiplying the value set as the input digital value "1" by the second natural number (for example, a value=102.4 μm which is 51200 times greater than 2 nm) is set as an FOV size (a value of a field of view). In a case where a digital signal which is input to the ion beam control unit 11 is repeatedly generated and output on the basis of these set results, an input digital value can correspond to a value of a natural number multiple of a slice amount without an error at all times. Therefore, according to the present embodiment, it is possible to increase processing accuracy without increasing the number of bits of a digital/analog converter.

In addition, as described with reference to FIG. 2, an FOV size is set by switching a case of changing the FOV size and a case of not changing the FOV size. Consequently, it is possible to restrict a case where an FOV size is set to a value (a value which causes a fractional figure) different from an instruction (typically, a value which is easily understood and does not cause a fractional figure is input) given by an operator.

In addition, the present invention achieves a great effect in a sample which is required to be very widely observed but is not limited to the above-described biological sample and is also effective to other samples such as a battery material.

Further, an embodiment of the present invention is not limited to the above-described embodiment. For example, the electron beam column 2 may be changed to another ion beam column or the electron beam column 2 may be omitted, and the sample stage 5 may be rotated, so that processing and a three-dimensional observation can be performed by using the ion beam column 1 only. Still further, the configuration regarding the electron beam column 2 may be omitted from the configuration of the cross-section processing observation apparatus 100 illustrated in FIG. 1 so that the cross-section processing observation apparatus 100 is constituted by a single ion beam device or is constituted as a processing apparatus including the ion beam device. The number of bits of the DAC is not limited to 16 bits, and may be any number of bits. The configuration of each unit which is illustrated as a divided block in FIG. 1 may be modified as appropriate, for example, through integration of a plurality of blocks or subdivision of a block.

What is claimed is:
1. A charged particle beam device comprising:
   a charged particle beam column comprising:
      a charged particle beam generation-focusing portion configured to generate and focus a charged particle beam; and
      a deflector configured to perform scanning with the charged particle beam in a two-dimensional direction;
   a charged particle beam control unit, which is configured to control the charged particle beam generation-focusing portion and the deflector, and which comprises a digital/analog converter for converting an input digital signal into an analog signal that is to be input to the deflector; and
   a field-of-view setting unit configured to set a value of a field of view of the charged particle beam where the scanning by the deflector is performed on the basis of a set value of a slice amount, the field-of-view setting unit being configured to set a value of one-nth of the slice amount, where n is a first natural number, as an input digital value "1" of the digital/analog converter and to set a value obtained by multiplying said value set as the input digital value "1" by a second natural number as a value of the field of view.

2. The charged particle beam device according to claim 1, further comprising:
   a display unit for displaying a charged particle beam image with the field of view set by the field-of-view setting unit.

3. The charged particle beam device according to claim 1, wherein the field-of-view setting unit is configured to switch:
   a case where the value of one-nth of the slice amount is set as the input digital value "1" of the digital/analog converter, and the value obtained by multiplying said value set as the input digital value "1" by the second natural number is set as the value of the field of view; and a case where the value of the field of view is set, and the slice amount calculated from said set value of the field of view is set as the input digital value "1" of the digital/analog converter, and wherein the field-of-view setting unit is configured to set the value of the field of view of the charged particle beam by the scanning performed by the deflector and the slice amount.

4. A cross-section processing observation apparatus comprising:

the charged particle beam device according to claim 1; and an observation device for observing a sample processed by the charged particle beam device.

5. A control method for a charged particle beam device that comprises a charged particle beam column comprising a charged particle beam generation-focusing portion configured to generate and focus a charged particle beam and a deflector configured to perform scanning with the charged particle beam in a two-dimensional direction; a charged particle beam control unit that controls the charged particle beam generation-focusing portion and the deflector that and includes a digital/analog converter for converting an input digital signal into an analog signal that is to be input to the deflector; and a field-of-view setting unit, the method comprising:

using the charged particle beam control unit to control the field-of-view setting unit to set a value of a field of view of a charged particle beam where the scanning by the deflector is performed on the basis of a set value of a slice amount; and using the field-of-view setting unit to set a value of one-nth of the slice amount, where n is a first natural number, as an input digital value "1" of the digital/analog converter and to set a value obtained by multiplying said value set as the input digital value "1" by a second natural number as a value of the field of view.

* * * * *